(12) United States Patent
Timme et al.

(10) Patent No.: US 8,883,560 B2
(45) Date of Patent: Nov. 11, 2014

(54) MANUFACTURING OF A DEVICE INCLUDING A SEMICONDUCTOR CHIP

(75) Inventors: Hans-Joerg Timme, Ottobrunn (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 152 days.

(21) Appl. No.: 12/901,770

(22) Filed: Oct. 11, 2010

(65) Prior Publication Data
US 2012/0086129 A1 Apr. 12, 2012

(51) Int. Cl.
| | | |
|---|---|---|
| H01L 23/48 | (2006.01) | |
| H01L 21/683 | (2006.01) | |
| H01L 23/00 | (2006.01) | |
| H01L 21/56 | (2006.01) | |
| H01L 23/538 | (2006.01) | |

(52) U.S. Cl.
CPC ... *H01L 23/5389* (2013.01); *H01L 2924/01047* (2013.01); *H01L 21/6836* (2013.01); *H01L 2224/21* (2013.01); *H01L 2224/81801* (2013.01); *H01L 2924/13055* (2013.01); *H01L 2224/211* (2013.01); *H01L 2924/01078* (2013.01); *H01L 2924/10271* (2013.01); *H01L 2924/13091* (2013.01); *H01L 24/19* (2013.01); *H01L 21/568* (2013.01); *H01L 2224/215* (2013.01); *H01L 24/20* (2013.01); *H01L 2924/14* (2013.01); *H01L 2924/13062* (2013.01); *H01L 2924/01079* (2013.01); *H01L 2221/68304* (2013.01); *H01L 2224/16227* (2013.01); *H01L 2924/01033* (2013.01); *H01L 21/561* (2013.01); *H01L 2924/1305* (2013.01); *H01L 2924/10272* (2013.01); *H01L 21/6835* (2013.01); *H01L 2924/01074* (2013.01); *H01L 24/06* (2013.01); *H01L 2924/01005* (2013.01); *H01L 2224/19* (2013.01); *H01L 2924/01013* (2013.01); *H01L 2224/06181* (2013.01); *H01L 2927/01082* (2013.01); *H01L 2924/01023* (2013.01); *H01L 2221/68381* (2013.01); *H01L 2924/10329* (2013.01); *H01L 2924/01029* (2013.01); *H01L 24/16* (2013.01); *H01L 2221/68368* (2013.01); *H01L 2224/12105* (2013.01); *H01L 2224/97* (2013.01); *H01L 2924/01024* (2013.01); *H01L 2221/68359* (2013.01); *H01L 2224/13111* (2013.01); *H01L 2924/10253* (2013.01); *H01L 2924/01006* (2013.01); *H01L 2924/014* (2013.01); *H01L 2924/12044* (2013.01)

USPC ..... 438/106; 438/121; 438/675; 257/E23.011

(58) Field of Classification Search
USPC .................................... 438/106, 121
See application file for complete search history.

(56) References Cited

U.S. PATENT DOCUMENTS

| | | | | |
|---|---|---|---|---|
| 7,952,208 | B2 * | 5/2011 | Fujita et al. | 257/778 |
| 2008/0318418 | A1 * | 12/2008 | Norman | 438/652 |
| 2009/0008767 | A1 * | 1/2009 | Kutlu | 257/692 |
| 2009/0191665 | A1 * | 7/2009 | Nikitin et al. | 438/107 |
| 2010/0016928 | A1 * | 1/2010 | Zdeblick et al. | 607/72 |

FOREIGN PATENT DOCUMENTS

DE 10 2007 043 291 A1 4/2009

* cited by examiner

*Primary Examiner* — Alexander Ghyka
(74) *Attorney, Agent, or Firm* — Slater & Matsil, L.L.P.

(57) ABSTRACT

A method includes providing a semiconductor chip having a first main surface and a second main surface opposite to the first main surface. An electrically insulating material is deposited on the first main surface of the semiconductor chip using a plasma deposition method. A first electrically conductive material is deposited on the second main surface of the semiconductor chip using a plasma deposition method.

28 Claims, 6 Drawing Sheets

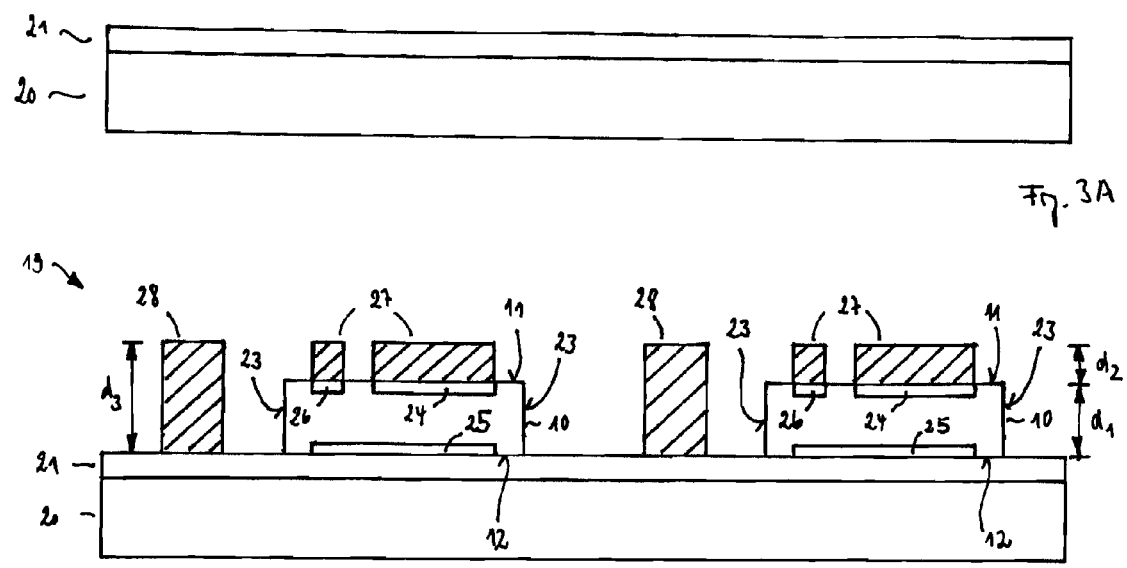
Fig. 3A
Fig. 3B
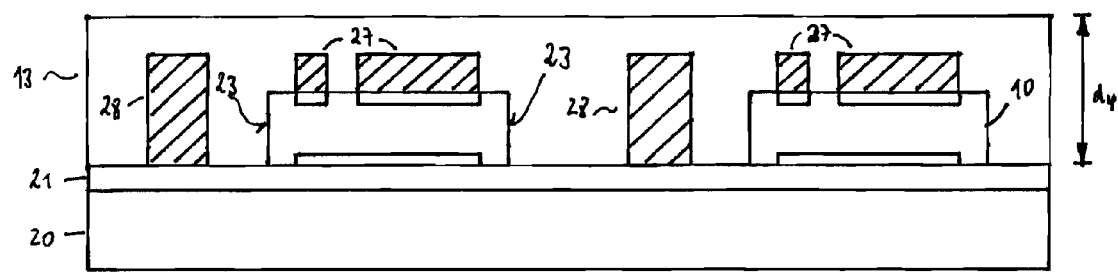
Fig. 3C
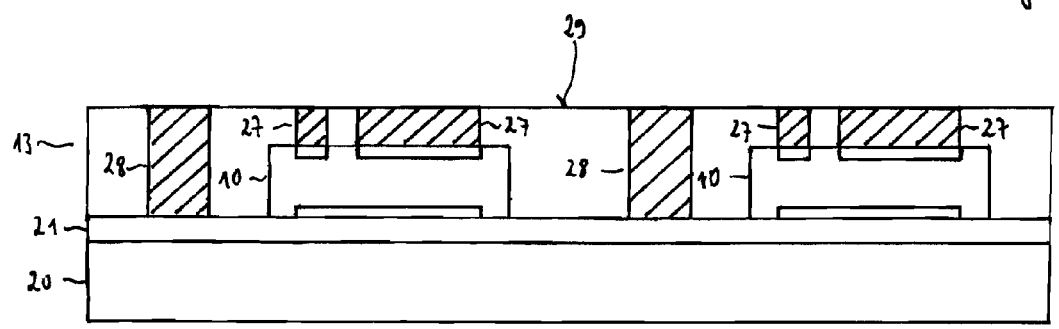
Fig. 3D

MANUFACTURING OF A DEVICE INCLUDING A SEMICONDUCTOR CHIP

TECHNICAL FIELD

This invention relates to a method of manufacturing a device including a semiconductor chip. The invention further relates to a device including a semiconductor chip.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Packaging semiconductor chips increases the cost and complexity of manufacturing semiconductor devices because the packaging designs shall not only provide protection, they shall also permit transmission of electrical signals to and from the semiconductor chips and, in particular, removal of heat generated by the semiconductor chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A-3J schematically illustrate a cross-sectional view of one embodiment of a method of manufacturing a device including a semiconductor chip and an electrically insulating layer and an electrically conductive layer deposited on the semiconductor chip using a plasma deposition method;

DETAILED DESCRIPTION OF ILLUSTRATIVE EMBODIMENTS

Figure 1A:
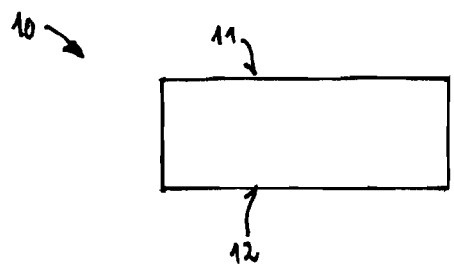
FIGS. 1A-1C schematically illustrate a cross-sectional view of one embodiment of a method including depositing an electrically insulating material and an electrically conductive material on a semiconductor chip.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its top side and bottom side. In particular, power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of power semiconductor chips.

The semiconductor chips may have electrodes (or contact elements or contact pads) which allow electrical contact to be made with the integrated circuits included in the semiconductor chips. One or more metal layers may be applied to the electrodes. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The devices may contain one or more electrically conductive layers, for example, metal layers. The electrically conductive layers may, for example, be used to produce redistribution layers. The electrically conductive layers may be used as wiring layers to make electrical contact with the semiconductor chips from outside the devices or to make electrical contact with other semiconductor chips and/or components contained in the devices. The electrically conductive layers may be manufactured with any desired geometric shape and any desired material composition. The electrically conductive layers may, for example, entirely consist of metals or metal alloys. The electrically conductive layers may, for example, be processed to conductor tracks, but may also be in the form of a layer covering an area. Any desired metals, for example, copper, aluminum, nickel, palladium, silver, tin or gold, metal alloys or metal stacks may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between electrically insulating layers. It may be provided that at least one of the electrically conductive layers is produced by a plasma deposition method.

The semiconductor chips or at least parts of the semiconductor chips may be covered with an electrically insulating material. The electrically insulating material may cover any fraction of any number of surfaces of the components of the device. The electrically insulating material may serve various functions. It may be used, for example, to electrically insulate components of the device from each other and/or from external components, but the electrically insulating material may also be used as a platform to mount other components, for example, wiring layers. The electrically insulating material may be used to produce fan-out type packages. In a fan-out type package at least some of the external contact elements and/or conductor tracks connecting the semiconductor chip to the external contact elements are located laterally outside of the outline of the semiconductor chip or at least intersect the outline of the semiconductor chip. Thus, in fan-out type packages, a peripherally outer part of the package of the semiconductor chip is typically (additionally) used for electrically bonding the package to external applications, such as application boards, etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The electrically insulating material and/or the electrically conductive material may be deposited by using a plasma deposition method. For this purpose, a plasma jet may be generated and may be mixed with a carrier gas containing the electrically insulating material and/or the electrically conductive material. By mixing the plasma jet with the carrier gas the carrier gas is activated or a particle beam is generated which impinges the semiconductor chip. The plasma jet may be mixed with the carrier gas in a reaction chamber which is physically separated from the generation of the plasma jet. The same plasma deposition apparatus may be used for the deposition of the electrically insulating material and the electrically conductive material.

The devices described below include external contact elements, which may be of any shape, size and material. The external contact elements may be accessible from outside the device and may thus allow electrical contact to be made with the semiconductor chips from outside the device. Furthermore, the external contact elements may be thermally conducting and may serve as heat sinks for dissipating the heat generated by the semiconductor chips. The external contact elements may be composed of any desired electrically conducting material. The external contact elements may include external contact pads. Solder material may be deposited on the external contact pads. The solder material may have the shape of solder balls and may, for example, be composed of SnPb, SnAg, SnAgCu, SnAgCuNi, SnAu, SnCu and/or SnBi.

Figure 1B:
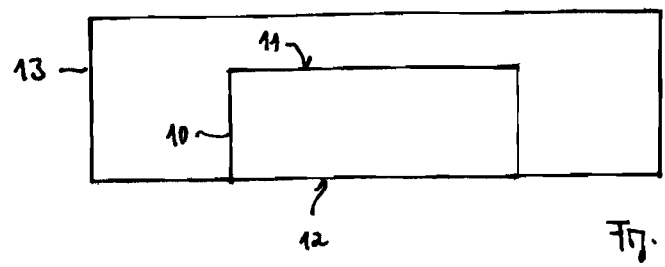
Figure 1C:
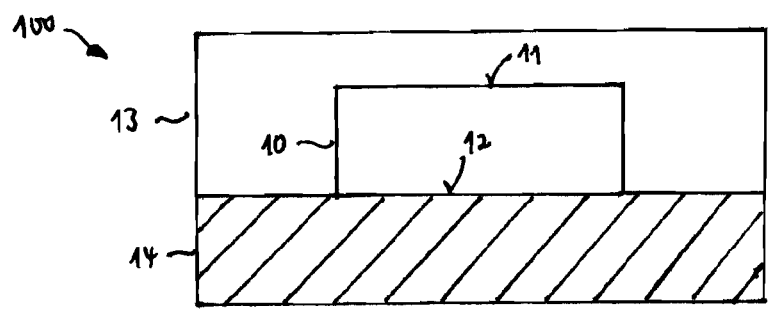

FIGS. 1A-1C schematically illustrate a cross-sectional view of a method of manufacturing a device 100, which is illustrated in FIG. 1C. A semiconductor chip 10 is provided as illustrated in FIG. 1A. The semiconductor chip 10 has a first main surface 11 and a second main surface 12 opposite to the first surface 11. An electrically insulating material 13 is deposited on the first main surface 11 of the semiconductor chip 10 as illustrated in FIG. 1B. An electrically conductive material 14 is deposited on the second main surface 12 of the semiconductor chip 10 as illustrated in FIG. 1C. According to one embodiment, the electrically insulating material 13 is deposited by using a plasma deposition method. According to one embodiment, the electrically conductive material 14 is deposited by using a plasma deposition method. According to one embodiment, both the electrically insulating material 13 and the electrically conductive material 14 are deposited by using a plasma deposition method.

Figure 2:
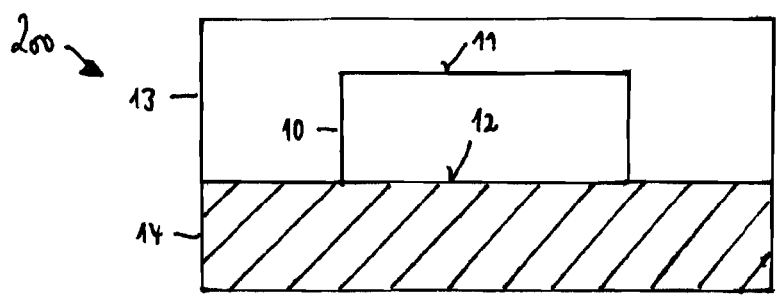
FIG. 2 schematically illustrates a cross-sectional view of one embodiment of a device including a semiconductor chip and layers deposited on the semiconductor chip.

FIG. 2 schematically illustrates a cross-sectional view of a device 200. The device 200 includes a semiconductor chip 10 having a first main surface 11 and a second main surface 12 opposite to the first surface 11. An electrically insulating material 13 covers the first main surface 11 of the semiconductor chip 10, and an electrically conductive material 14 covers the second main surface 12 of the semiconductor chip 10. According to one embodiment, the electrically insulating material 13 is plasma deposited. According to one embodiment, the electrically conductive material 14 is plasma deposited. According to one embodiment, both the electrically insulating material 13 and the electrically conductive material 14 are plasma deposited.

Figure 3E:
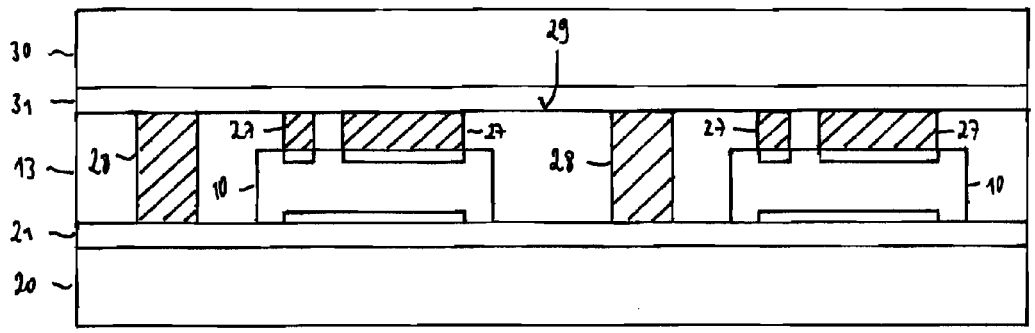
Figure 3F:
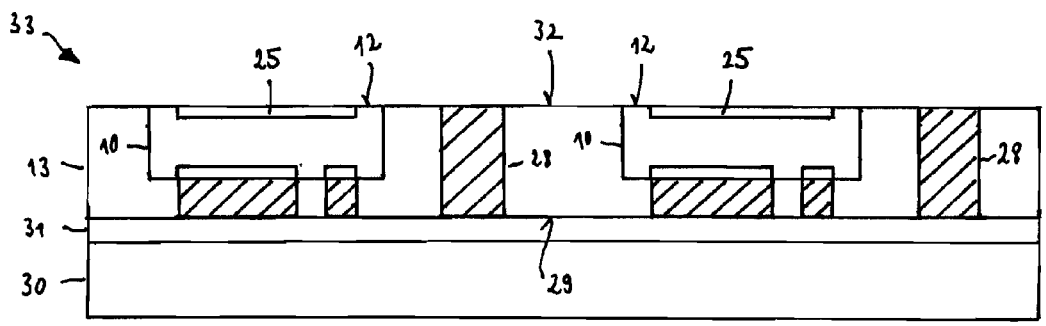
Figure 3G:
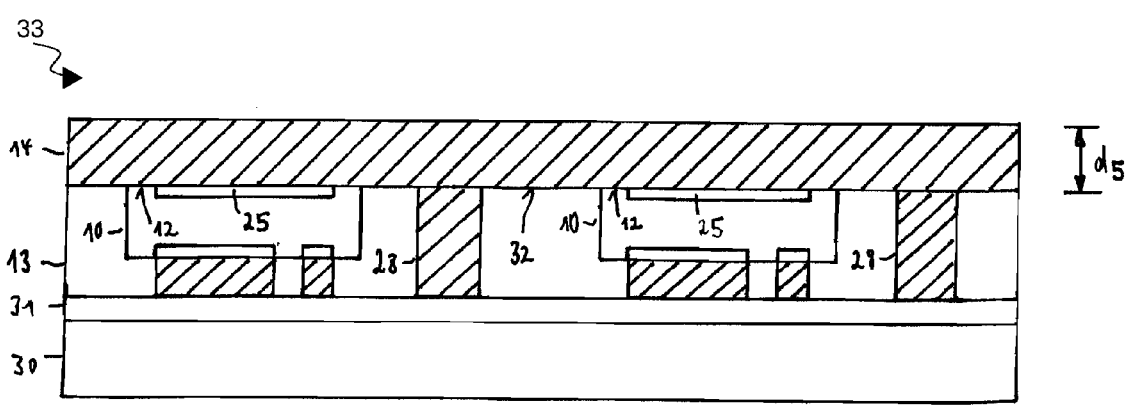
Figure 3H:
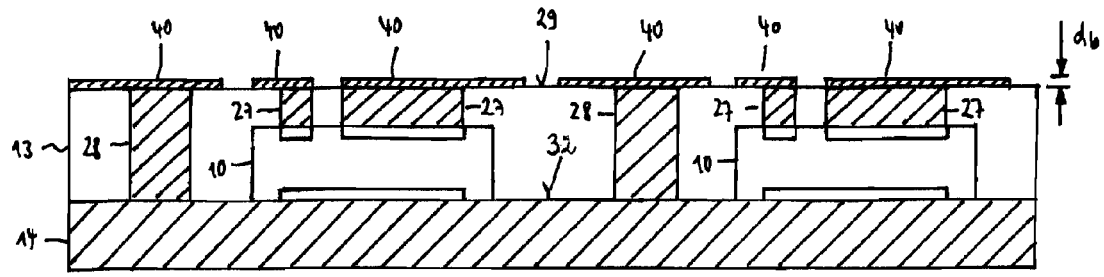
Figure 3I:
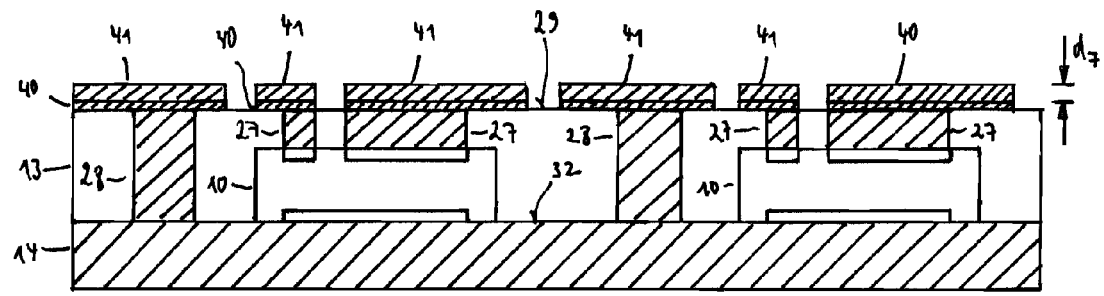
Figure 3J:
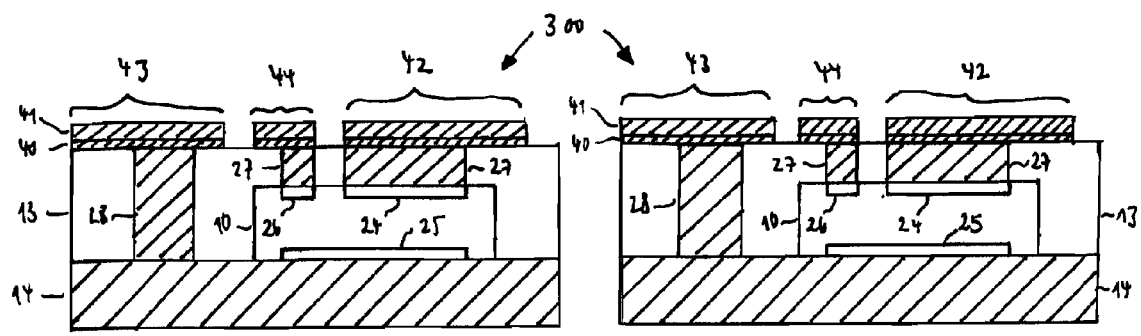

FIGS. 3A-3J schematically illustrate a cross-sectional view of one embodiment of a method of manufacturing devices 300, which are illustrated in FIG. 3J. The manufacturing method illustrated in FIGS. 3A-3J is an implementation of the manufacturing method illustrated in FIGS. 1A-1C. The details of the manufacturing method that are described below can therefore be likewise applied to the method of FIGS. 1A-1C. Moreover, the device 300 is an implementation of the device 200 illustrated in FIG. 2. The details of the device 300 that are described below can therefore be likewise applied to the device 200. Similar or identical components of the devices 100, 200 and 300 are denoted by the same reference numerals.

FIG. 3A illustrates that a carrier 20 is provided. The carrier 20 may be a plate or a foil made of a rigid material, for example, a metal or a metal alloy, such as copper, aluminum, nickel, CuFeP, steel or stainless steel, laminate, film, polymer composites, ceramics or a material stack. The carrier 20 may have a planar upper surface on which the semiconductor chips 10 can be placed later on. The shape of the carrier 20 is not limited to any geometric shape, and the carrier 20 may have any appropriate size. For example, the thickness of the carrier 20 may be in the range from 50 µm to 1 mm. A polymer foil 21, for example, a double sided sticky tape, may be placed onto the upper surface of the carrier 20.

FIG. 3B illustrates that two semiconductor chips 10 as well as possibly further semiconductor chips 10 are placed on the polymer foil 21. Any suitable array of semiconductor chips 10 may be placed on the polymer foil 21 (only two of the semiconductor chips 10 are shown in FIG. 3B). For example, more than 50 or 500 or 1000 semiconductor chips 10 may be placed on the polymer foil 21. The semiconductor chips 10 are relocated on the polymer foil 21 in larger spacings as they have been in the wafer bond. The semiconductor chips 10 may have been manufactured on the same semiconductor wafer, but may alternatively have been manufactured on different wafers. Furthermore, the semiconductor chips 10 may be physically identical, but may also contain different integrated circuits and/or represent other components and/or may have different outer dimensions and/or geometries. The semiconductor chips 10 may have a thickness $d_1$ (distance between the first main surface 11 and the second main surface 12) in the range between 20 µm and several hundred micrometers and, in particular, in the range from 50 µm to 100 µm.

Each of the semiconductor chips 10 has a first main surface 11, a second main surface 12 opposite to the first main surface 11 and side surfaces 23 extending from the first main surface 11 to the second main surface 12. The semiconductor chips 10 may be placed on the polymer foil 21 with their second main surfaces 12 facing the polymer foil 21 and their first main surfaces 11 facing away from the polymer foil 21.

The semiconductor chips 10 may be power semiconductor chips and may have a first electrode 24 on the first main surface 11 and a second electrode 25 on the second main surface 12. The power semiconductor chips 10 may, for example, be power diodes or power transistors, such as power MOSFETs, IGBTs, JFETs or power bipolar transistors. In the case of power MOSFETs, which is exemplarily shown in FIG. 3B, the first and second electrodes 24 and 25 may be source and drain electrodes (load electrodes), respectively. Furthermore, the power semiconductor chips 10 may have third electrodes 26 on their first main surfaces 11 functioning as gate electrodes (control electrodes) where the power semiconductor chips 10 are power MOSFETs. During operation, voltages of up to 5, 50, 100, 500 or 1000 V or even higher may be applied between the load electrodes 24 and 25. The switching frequency applied to the control electrode 26 may be in the range from 1 kHz to 100 MHz, but may also be outside this range.

Metal layers 27 may be applied to the electrodes 24, 26 arranged on the first main surfaces 11 of the semiconductor chips 10 facing away from the polymer foil 21. The metal layers 27 may be manufactured when the semiconductor chips 10 are still in the wafer bond. The metal layers 27 may form contact pads on the electrodes 24 and 26. Any desired metal or metal alloy including, for example, aluminum, titanium, gold, silver, copper, palladium, platinum, nickel, chromium or nickel vanadium, may be used as the material. The metal layers 27 may have a thickness $d_2$ in the range from 3 µm to 50 µm and, in particular, in the range from 5 µm to 30 µm.

Adjacent to each semiconductor chip 10 a post 28 may be placed. The posts 28 may be made from a metal or metal alloy, for example, copper or aluminum. The posts 28 may have a height $d_3$ in the range from 20 µm to 200 µm and, in particular, in the range from 80 µm to 120 µm. According to one embodiment, the posts 38 have a similar or the same height as the semiconductor chips 10 with the metal layers 27, for example, $d_3=d_1+d_2\pm 5$ µm or $d_3=d_1+d_2$.

A pick-and-place machine may be used capable of picking the semiconductor chips 10 and the posts 28 and placing them on the polymer foil 21. A working piece 19 including the carrier 20, the polymer foil 21, the semiconductor chips 10 and the posts 28 may be used for the next processing steps.

FIG. 3C illustrates an electrically insulating material 13 which is deposited on the semiconductor chips 10 and the posts 28 by means of an atmospheric plasma deposition method. For this purpose, the working piece 19 may be placed in a plasma deposition apparatus as exemplarily shown in FIG. 5. During plasma deposition temperatures higher than 150° C. are usually not reached. Therefore the polymer foil 21 and the metal layers 27 on the second main surfaces 12 of the semiconductor chips 10 are not affected by the plasma deposition. The electrically insulating material 13 may, for example, be a polymer or ceramic material. The electrically insulating material 13 may cover the metal layers 27, the posts 28, the side surfaces 23 of the semiconductor chips 10 and the exposed portions of the polymer foil 21. The layer formed of the electrically insulating material 13 may have an upper surface which is coplanar to the upper surface of the carrier 20. A thickness $d_4$ of the layer made of the electrically insulating material 13 (measured from the upper surface of the polymer foil 21 to the upper surface of the electrically insulating material 13) may be in the range from 30 µm to 200 µm and, in particular, in the range from 80 µm to 120 µm. Alternatively, the thickness $d_4$ may be larger than 60 µm or 70 µm or 80 µm or 90 µm or 100 µm. The thickness $d_4$ may be greater than or equal to the thickness of the semiconductor chips 10 with the metal layers 27, i.e., $d_4 \geq d_1+d_2$. The thickness $d_4$ may also be greater than or equal to the height $d_3$ of the posts 28, i.e., $d_4 \geq d_3$.

FIG. 3D illustrates that the layer of the electrically insulating material 13 may be thinned until the upper surfaces of the metal layers 27 and the posts 28 are exposed. For this purpose the electrically insulating material 13 may be partially removed, for example, by means of grinding or polishing. After the thinning step an upper surface 29 of the electrically insulating material 13 (which is also the upper surface of the metal layers 27 and the posts 28) may be essentially planar and coplanar to the upper surface of the carrier 20.

FIG. 3E illustrates a carrier 30 that is attached to the planar surface 29 of the electrically insulating material 13 by means of a polymer foil 31. Similar to the carrier 20, the carrier 30 may be a plate or a foil made of a rigid material, for example, a metal or a metal alloy, such as copper, aluminum, nickel, CuFeP, steel or stainless steel, laminate, film, polymer composites, ceramics or a material stack. The carrier 30 may have a planar surface which is attached to the surface 29 of the electrically insulating material 13. Prior to the attachment to the electrically insulating material 13, the polymer foil 31, for example, a double sided sticky tape, may have been attached to the carrier 30.

FIG. 3F illustrates that the carrier 20 and the polymer foil 21 are released from the electrically insulating material 13, the semiconductor chips 10 and the posts 28. The polymer foil 21 may be sensitive to UV light and may be released by exposure to UV light. Moreover, the polymer foil 21 may feature thermo-release properties, which allow the removal of the polymer foil 21 during a heat-treatment.

After the removal of the carrier 20 and the polymer foil 21 a planar surface 32 of the electrically insulating material 13 is exposed. The planar surface 32 is opposite to the planar surface 29. The second main surfaces 12 including the second electrodes 25 of the semiconductor chips 10 and surfaces of the posts 28 are also exposed on the planar surface 32. The carrier 30 can enable handling of the working piece 33 including the semiconductor chips 10, the posts 28 and the electrically insulating material 13 in subsequent processing steps.

FIG. 3G illustrates an electrically conductive material 14 which is deposited on the planar surface 32 of the working piece 33 by means of an atmospheric plasma deposition method and covers the exposed surfaces of the electrically insulating material 13, the semiconductor chips 10 and the posts 28. For this purpose, the working piece 33 may be placed in a plasma deposition apparatus, which may be the same apparatus that is used for the deposition of the electrically insulating material 13.

The electrically conductive layer 14 may, for example, entirely consist of metals or metal alloys, such as copper, aluminum, nickel, palladium, silver, tin or gold. A thickness $d_5$ of the layer made of the electrically conductive material 14 may be in the range from 30 µm to 150 µm and, in particular, may be larger than 30 µm or 40 µm or 50 µm or 60 µm or 70 µm or 80 µm.

The electrically conductive layer 14 may be electrically connected to the second electrodes 25 of the semiconductor chips 10 and the posts 28. Due to the plasma deposition process, the electrically conductive layer 14 shows a certain porosity.

After the deposition of the electrically conductive layer 14 the carrier 30 and the polymer foil 31 are released from the surface 29 of the electrically insulating material 13. The polymer foil 31 may be sensitive to UV light and may be released by exposure to UV light. Alternatively, the polymer foil 31 may feature thermo-release properties, which allow the removal of the polymer foil 31 during a heat-treatment. The now exposed planar surface 29 of the electrically insulating material 13, the metal layers 27 and the posts 28 may be used as a platform to deposit a redistribution layer.

FIG. 3H illustrates a seed layer 40 that is applied to the surface 29 of the electrically insulating material 13 and is electrically connected to the metal layers 27 and the posts 28. Moreover, the seed layer 40 is structured to generate conductor tracks as illustrated in FIG. 3H. The seed layer 40 may, for example, consist of titanium, titanium tungsten or palladium. The deposition of the seed layer 40 may be carried out by electroless deposition from a solution or by sputtering. The seed layer 40 may have a thickness $d_6$ in the range from 10 nm to 300 nm.

FIG. 3I illustrates a metal layer 41 which may be galvanically deposited onto the seed layer 40. The seed layer 40 can be used as an electrode for the galvanic deposition of the metal layer 41. The metal layer 41 may have a thickness $d_7$ of more than 1 µm and, in particular, several micrometer.

FIG. 3J illustrates that the devices 300 are separated from one another by separation of the electrically insulating material 13 and the electrically conductive material 14, for example, by sawing, cutting, milling, etching or a laser beam.

Portions of the metal layer 41 form external contact elements 42, 43 and 44, respectively. The external contact elements 42 are electrically coupled to the first electrodes 24 of the semiconductor chips 10 via the metal layer 27. The external contact elements 43 are electrically coupled to the second electrodes 25 of the semiconductor chips 10 via the posts 28 and the electrically conductive layer 14. The external contact elements 44 are electrically coupled to the third electrodes 26 of the semiconductor chips 10 via the metal layers 27.

The devices 300 manufactured by the method described above are fan-out type packages. The electrically insulating material 13 allows the redistribution layer to extend beyond the outline of the semiconductor chips 10. The external contact elements 42, 43 and 44 therefore do not need to be arranged within the outline of the semiconductor chips 10 but can be distributed over a larger area. At least some of the external contact elements 42, 43 and 44 may be arranged completely outside of the outline of the semiconductor chips 10. The increased area which is available for arrangement of the external contact elements 42, 43 and 44 as a result of the electrically insulating material 13 means that the external contact elements 42, 43 and 44 cannot only be arranged at a great distance from one another, but that the maximum number of external contact elements 42, 43 and 44 which can be arranged there is likewise increased compared to the situation when all the external contact elements 42, 43 and 44 are arranged within the outline of the semiconductor chips 10.

It is obvious to a person skilled in the art that the devices 300 illustrated in FIG. 3J and the manufacturing thereof as described above are only intended to be an exemplary embodiment, and many variations are possible. For example, further semiconductor chips or passives of different types may be included in the same device 300. The semiconductor chips and passives may differ in function, size, manufacturing technology etc. Moreover, the redistribution layer may include further metal layers.

According to one embodiment, the metal layer(s) forming the redistribution layer may be deposited by means of an atmospheric plasma deposition method. In particular, the same plasma deposition apparatus may be used for this purpose as used for the deposition of the electrically conductive material 14.

According to one embodiment, thinning the electrically insulating material 13 as illustrated in FIG. 3D is carried out after the deposition of the electrically conductive material 14 and the release of the carrier 30.

According to one embodiment, the electrically conductive vias through the electrically insulating material 13 are manufactured by producing holes in the electrically insulating material 13 and depositing electrically conductive material in the holes (as an alternative to the posts 28).

Figure 4:
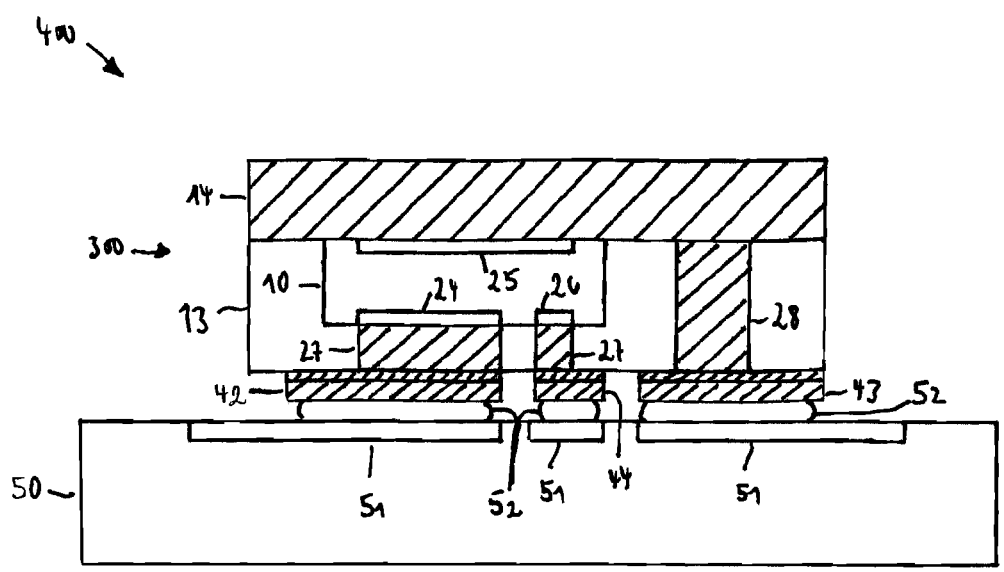
FIG. 4 schematically illustrates a cross-sectional view of one embodiment of a device mounted on a circuit board.

FIG. 4 schematically illustrates a system 400 including the device 300 mounted on a circuit board 50, for example, a printed circuit board (PCB). The external contact elements 42, 43 and 44 of the device 300 may face the circuit board 50. The circuit board 50 may have contact pads 51, and the external contact elements 42, 43 and 44 may be soldered to the contact pads 51 by means of solder deposits 52.

Figure 5:
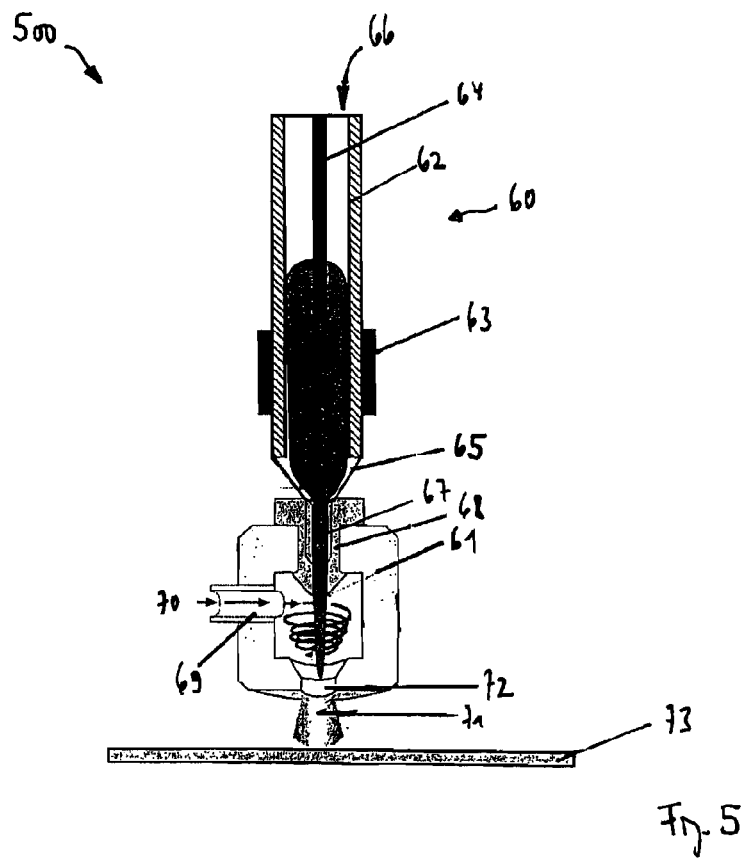
FIG. 5 schematically illustrates a cross-sectional view of one embodiment of a plasma deposition apparatus.

FIG. 5 schematically illustrates a plasma deposition apparatus 500. The plasma deposition apparatus 500 may be used for the deposition of the electrically insulating material 13 and/or the electrically conductive material 14 as illustrated in FIGS. 3C and 3G.

The plasma deposition apparatus 500 consists of a plasma jet (or beam) generator 60 and a reaction chamber 61 which is physically separated from the plasma jet generator 60.

The plasma jet generator 60 includes a dielectric barrier 62, for example, an electrically insulating tube, an outer electrode 63, which concentrically surrounds the dielectric barrier 62, and an inner electrode 64, which is accommodated at least partially within the dielectric barrier 62. The plasma jet generator 60 is completed at one end by a plasma head 65.

When operating the plasma jet generator 60, a glow discharge is generated by applying an appropriate voltage to the two electrodes 63 and 64. In the direction indicated by an arrow 66 in FIG. 5 a process gas is supplied, thereby generating a plasma jet 67. The plasma jet 67 leaves the plasma jet generator 60 via the plasma head 65.

The plasma jet generator 60 is connected to the reaction chamber 61 via an opening 68 in the reaction chamber 61 to allow the plasma jet 67 to flow into the reaction chamber 61. The opening 68 may be sealed against the opening of the plasma head 65 in order to avoid the entry of ambient air into the reaction chamber 61. The reaction chamber 61 is physically separate from the generation of the plasma jet 67.

The reaction chamber 61 has an inlet 69 which allows a carrier gas 70 to be blown into the reaction chamber 61. The carrier gas 70 is introduced into the reaction chamber 61 and mixed with the generated plasma jet 67 such that the carrier gas 70 is activated or a particle beam is generated. The activated carrier gas 71 leaves the reaction chamber 61 via an outlet 72. A working piece 73, for example, one of the working pieces 19 and 33 of FIGS. 3B and 3F, is positioned such that the activated carrier gas 71 coats the surface of the working piece 73.

As shown in FIG. 5, the inlet 69 for the carrier gas 70 may be arranged laterally to the plasma jet 67 so that the carrier gas 70 is introduced into the reaction chamber 61 such that a swirl or a deflection of the plasma jet 67 is effected.

The carrier gas 70 contains the particles to be deposited on the working piece 73, i.e. the electrically insulating material 13 or the electrically conductive material 14. The gas stream and/or particle stream in the carrier gas 70 is mixed with the plasma jet 67 in the reaction chamber 61. Thereby a large portion of the energy of the plasma jet 67 is transferred to the gas stream and/or particle stream in the carrier gas 70. Therefore only a very small portion of the plasma jet 67 comes in contact with the surface of the working piece 73.

Ambient air may be excluded from the reaction chamber 61, for example, by applying a suitable pressure. This avoids undesired side reactions between ambient air, plasma jet 67 and carrier gas 70.

The plasma deposition apparatus 500 allows to produce thick layers of plasma deposited material, which may be electrically insulating or conductive. Layers thicker than 30 µm or 40 µm or 50 µm or 60 µm or 70 µm or 80 µm or higher may be produced by means of the plasma deposition apparatus 500.

The plasma deposition apparatus 500 may be used to create plasma polymerized layers. In the plasma polymerization process, the carrier gas 70, which is pumped into the reaction chamber 61, contains a monomer gas. The monomer may start out as a liquid and is converted to a gas in an evaporator before it is pumped into the reaction chamber 61. In the reaction chamber 61, the plasma jet 67 ionizes the monomer molecules. The monomer molecules break apart (fractionate) creating free electrons, ions, excited molecules and radicals. The radicals adsorb, condense and polymerize on the substrate 73. The electrons and ions crosslink or create a chemical bond with already deposited molecules. Since the monomers are fractionated into different reactive particles, the chemical structure of the carrier gas 70 is only partially maintained which results in crosslinking and a random structure of the polymerized layer. Plasma polymerization may also be used to produce polymer layers of organic compounds that do not polymerize under normal chemical polymerization conditions because such processes involve electron impact dissociation and ionization for chemical reactions.

The electrically insulating layer 13 may be prepared by plasma polymerization using monomers including, for example, tetraethoxysilane (TEOS), hexamethyldisiloxane (HMDSO), tetramethylsilane, vinyltremethylsilane, maleic anhydride, hexafluoropropylene (HFP), tetrafluoroethylene (TFE), vinyl chloride, epoxy compounds and/or any other appropriate compounds.

Figure 6:
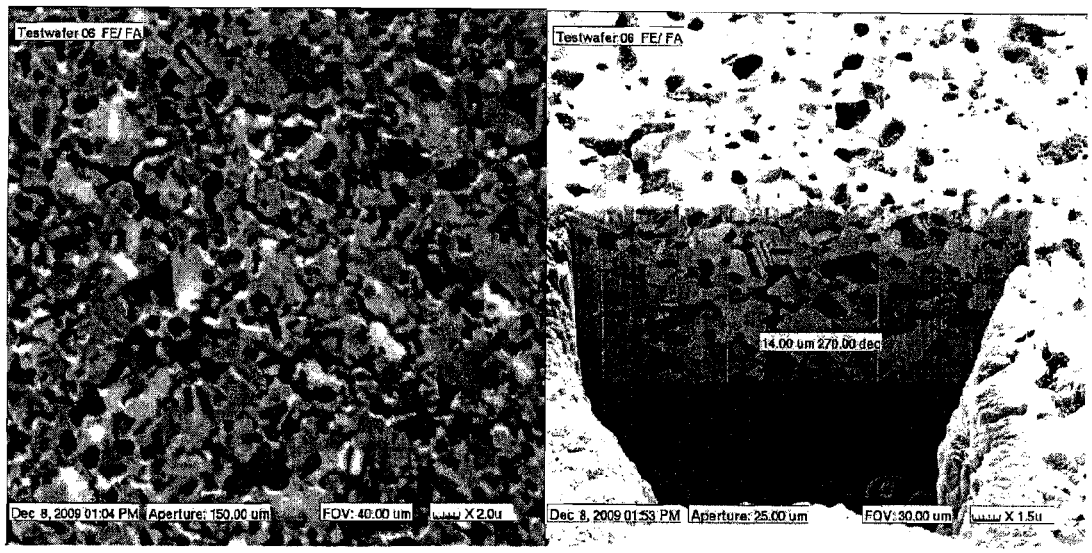
FIG. 6 shows electron micrograph images of a layer deposited by a plasma deposition method.

FIG. 6 shows electron micrograph images of a copper layer deposited by means of a plasma deposition apparatus similar to the one shown in FIG. 5. It can be seen from FIG. 6 that the copper layer exhibits a certain porosity due to the plasma deposition.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   placing a plurality of semiconductor chips on a carrier, each of the semiconductor chips having a first main surface and a second main surface opposite to the first main surface;
   placing a plurality of metal posts on the carrier, each of the metal posts having a first main surface and a second main surface opposite to the first main surface;
   plasma depositing an electrically insulating material over the first main surfaces of the semiconductor chips, the first main surfaces of the metal posts and the carrier;
   removing the carrier thereby exposing the second main surfaces of the metal posts and the second main surfaces of the semiconductor chips; and
   plasma depositing an electrically conductive material on the exposed second main surfaces of the metal posts and the exposed second main surfaces of the semiconductor chips.

2. The method of claim 1, wherein the electrically conductive material comprises a porous electrically conductive material.

3. A method, comprising:
   placing a semiconductor chip and a post on a first carrier, the semiconductor chip having a first main surface and a second main surface opposite to the first main surface;
   depositing an electrically insulating material on the first main surface of the semiconductor chip, the post and the carrier using a first plasma deposition method;
   forming a first surface of the electrically insulating material and exposing a top surface of the post by thinning the electrically insulating material;
   placing a second carrier on the first surface of the electrically insulating material and the top surface of the post;

removing the first carrier thereby exposing a second surface of the electrically insulating material;

depositing a first electrically conductive material on the second surface of the electrically insulating material using a second plasma deposition method;

removing the second carrier thereby exposing the first surface of the electrically insulating material and the top surface of the post; and depositing a second electrically conductive material on the first surface of the electrically insulating material.

4. The method of claim 3, wherein the first electrically conductive material comprises a porous electrically conductive material.

5. The method of claim 3, wherein the first electrically conductive material is deposited over the entire second surface of the electrically insulating material.

6. The method of claim 1, further comprising partially removing the electrically insulating material thereby exposing the first main surfaces of the metal posts and the first main surfaces of the semiconductor chips.

7. The method of claim 6, wherein exposing the first main surfaces of the semiconductor chips comprises exposing metal layers disposed on electrodes of the semiconductor chips.

8. A method, comprising:

plasma depositing an electrically insulating material on a first main surface of a semiconductor chip and a first main surface of a conductive post, the conductive post disposed adjacent the semiconductor chip;

partially removing the electrically insulating material thereby exposing the first main surface of the conductive post and the first main surface of the semiconductor chip;

removing a carrier from a second main surface of the conductive post and the second main surface of the semiconductor chip;

plasma depositing a first electrically conductive material on the second main surface of the semiconductor chip and a second main surface of the conductive post, the second main surfaces being opposite to the first main surfaces; and forming a second electrically conductive material on the first main surface of the conductive post and the first main surface of the semiconductor chip.

9. The method of claim 8, wherein exposing the first main surface of the semiconductor chip comprises exposing a metal layer disposed on electrodes of the semiconductor chip.

10. The method of claim 8, wherein the conductive post is a metal post.

11. The method of claim 8, wherein plasma depositing the electrically insulating material comprises plasma depositing the electrically insulating material below a temperature of 150° C.

12. The method of claim 1, wherein plasma depositing the electrically insulating material comprises plasma depositing the electrically insulating material below a temperature of 150° C.

13. The method of claim 1, wherein the metal posts comprise copper.

14. A method, comprising:

placing a plurality of semiconductor chips on a first carrier, each of the semiconductor chips having a first main surface and a second main surface opposite to the first main surface;

placing a plurality of conductive posts on the first carrier, each of the conductive posts having a first main surface and a second main surface opposite to the first main surface;

plasma depositing an electrically insulating material over the first main surfaces of the semiconductor chips, the first main surfaces of the conductive posts and the first carrier;

removing the first carrier thereby exposing the second main surfaces of the conductive posts and the second main surfaces of the semiconductor chips; and plasma depositing an electrically conductive material on the exposed second main surfaces of the conductive posts and the exposed second main surfaces of the semiconductor chips.

15. The method of claim 14, wherein plasma depositing the electrically insulating material comprises plasma depositing the electrically insulating material below a temperature of 150° C.

16. The method of claim 14, wherein each semiconductor chip has a first electrode on the first main surface and a second electrode on the second main surface.

17. The method of claim 14, further comprising applying a metal layer to a first electrode of each semiconductor chip before plasma depositing the electrically insulating layer.

18. The method of claim 17, further comprising, after the depositing the electrically insulating material, partially removing the electrically insulating material until the metal layer of each semiconductor chip is exposed.

19. The method of claim 14, wherein plasma depositing the electrically insulating material comprises plasma depositing the electrically insulating material below a temperature of 150° C.

20. The method of claim 14, wherein the electrically conductive material comprises a porous electrically conductive material.

21. The method of claim 14, further comprising:
thinning the electrically insulating material; and
attaching a second carrier to the first main surface of the semiconductor chips and the first main surfaces of the conductive posts before removing the first carrier.

22. The method of claim 14, wherein the conductive posts are higher than the semiconductor chips.

23. A method, comprising:

plasma depositing an electrically insulating material on a first main surface of a semiconductor chip and a first main surface of a conductive post, the conductive post disposed adjacent the semiconductor chip;

partially removing the electrically insulating material thereby exposing the first main surface of the conductive post and the first main surface of the semiconductor chip;

plasma depositing a first electrically conductive material on a second main surface of the semiconductor chip and a second main surface of the conductive post, the second main surfaces being opposite to the first main surfaces; and forming a second electrically conductive material on the first main surface of the conductive post and the first main surface of the semiconductor chip.

24. The method of claim 23, wherein the electrically conductive material comprises a porous electrically conductive material.

25. The method of claim 23, further comprising:
attaching a first carrier to the first main surface of the semiconductor chip and the first main surface of the conductive post;

flipping the semiconductor chip; and removing a second carrier from a second main surface of the semiconductor chip and the second main surface of the conductive post.

26. The method of claim 25, further comprising removing the first carrier from the first main surface of the semiconductor chips and the first main surface of the conductive post before forming the second electrically conductive material on the first main surface of the semiconductor chip and the first main surface of the conductive post.

27. The method of claim 23, wherein forming the second electrically conductive material comprises sputtering a seed layer of the second electrically conductive material and then galvanically depositing the second electrically conductive material.

28. The method of claim 23, wherein the conductive post is higher than the semiconductor chip.

* * * * *